(12) United States Patent
Zhang et al.

(10) Patent No.: US 11,794,462 B2
(45) Date of Patent: Oct. 24, 2023

(54) RGO-PEI/PVDF PYROELECTRIC THIN FILM AND ITS PREPARATION METHOD

(71) Applicant: China University Of Geosciences, Beijing, Beijing (CN)

(72) Inventors: Yihe Zhang, Beijing (CN); Haitao Li, Beijing (CN); Qi An, Beijing (CN); Wangshu Tong, Beijing (CN)

(73) Assignee: CHINA UNIVERSITY OF GEOSCIENCES, BEIJING, Beijing (CN)

( * ) Notice: Subject to any disclaimer, the term of this patent is extended or adjusted under 35 U.S.C. 154(b) by 194 days.

(21) Appl. No.: 17/201,178

(22) Filed: Mar. 15, 2021

(65) Prior Publication Data

US 2021/0296555 A1    Sep. 23, 2021

(30) Foreign Application Priority Data

Mar. 20, 2020   (CN) .......................... 202010198967.0

(51) Int. Cl.
*B32B 37/00* (2006.01)
*G01J 5/34* (2022.01)
(Continued)

(52) U.S. Cl.
CPC ............ *B32B 37/025* (2013.01); *B32B 9/007* (2013.01); *B32B 9/045* (2013.01); *B32B 27/304* (2013.01);
(Continued)

(58) Field of Classification Search
CPC ...... H10N 15/10; H10N 15/15; B32B 37/025; B32B 38/18; B32B 38/162; B32B 38/164; B32B 2307/20; B32B 2313/04; B32B 2327/12; B32B 2379/00; A44C 5/0007; Y10T 156/1034; Y10T 156/1051
(Continued)

(56) References Cited

FOREIGN PATENT DOCUMENTS

CN    106847534 A   *  6/2017

OTHER PUBLICATIONS

"A wearable solar-thermal-pyroelectric harvester: Achieving high power output using modified rGO-PEI and polarized PVDF", Li et al., Mar. 2020.*

* cited by examiner

*Primary Examiner* — John L Goff, II
(74) *Attorney, Agent, or Firm* — WPAT, PC

(57) ABSTRACT

The present invention belongs to the technical field of energy conversion devices, which provides an rGO-PEI/PVDF pyroelectric thin film, and the method for preparing the film, as well as a self-energized bracelet produced based on such film, which utilizes the reduced graphite oxide after modified by polyethyleneimine (PEI) (rGO-PEI) as photothermal conversion material, and the silver-plated polarized polyvinylidene fluoride (PVDF) film as pyroelectric conversion material. The rGO-PEI photothermal material is fixed to the surface of the PVDF through a transparent film, and prepare the self-energized bracelet based on it. The obtained bracelet has an output power of up to 21.3 mW/m2, and does not require additional mechanical devices to control the temperature during operation, wherein, the thermoelectric conversion, rectification, storage and application are realized through temperature fluctuation produced by absorbing sunlight during doing outdoor sports, utilizing temperature difference of air flow, and sweeping gesture, etc.

3 Claims, 2 Drawing Sheets

(51) Int. Cl.
  *B32B 27/30* (2006.01)
  *B32B 9/00* (2006.01)
  *B32B 9/04* (2006.01)
  *H10N 15/10* (2023.01)
  *B32B 38/18* (2006.01)
  B32B 37/24 (2006.01)
  B32B 38/16 (2006.01)
  B32B 38/00 (2006.01)

(52) U.S. Cl.
  CPC ............... *B32B 38/18* (2013.01); *G01J 5/34* (2013.01); *H10N 15/15* (2023.02); *B32B 38/162* (2013.01); *B32B 38/164* (2013.01); *B32B 2037/246* (2013.01); *B32B 2255/205* (2013.01); *B32B 2264/102* (2013.01); *B32B 2264/108* (2013.01); *B32B 2307/20* (2013.01); *B32B 2311/04* (2013.01); *B32B 2313/04* (2013.01); *B32B 2327/12* (2013.01); *B32B 2379/00* (2013.01); *B32B 2457/00* (2013.01)

(58) Field of Classification Search
  USPC ........................................ 156/242, 246, 230
  See application file for complete search history.

RGO-PEI/PVDF PYROELECTRIC THIN FILM AND ITS PREPARATION METHOD

FIELD OF THE INVENTION

The present invention generally relates to the technical field of energy conversion devices, specifically relates to an rGO-PEI/PVDF pyroelectric thin film and its preparation method.

BACKGROUND OF THE INVENTION

The emerging power generation technologies (piezoelectric nanogenerators, triboelectric nanogenerators, and pyroelectric nanogenerators, etc.) represent an important approach to solve the energy crisis. Compared with piezoelectric nanogenerators and triboelectric nanogenerators, pyroelectric nanogenerators (PENG) have unique advantages due to they can convert fluctuant waste heat existed in the environment into valuable electrical energy.

Among various PENGs, the pyroelectric nanogenerator (S-PENG) which collects solar thermal is a non-contact energy harvesting technology. Such S-PENG realizes the conversion of fluctuant optothermal to pyroelectricity by utilizing green and sustaining sunlight as a heat source for temperature variation. However, the temperature fluctuation of the S-PENG of the prior art in sunlight outside or in other natural environments (such as in wind environment) is usually slight, especially in the case of being exposed to continuous irradiation of sunlight. Thus, it is hard to obtain high-efficiency output of pyroelectricity by utilizing low-heat sunlight. In addition, the S-PENG always requires additional mechanical devices to shield sunlight in practical application, and thus obtains a rapid temperature oscillation frequency.

Therefore, although the S-PENG is a new technology that utilizes sunlight, its output power is quite low (<5 mW/m2), so that is not common in practical applications.

SUMMARY OF THE INVENTION

The purpose of the present invention is to provide an rGO-PEI/PVDF pyroelectric thin film and its preparation method based upon the defects of the prior art, which can perform high-efficiency output of pyroelectricity under solar radiation or when temperature fluctuations occurred at night, and also can complete high-efficiency electrical conversion of other quantity of heat radiated (such as the quantity of heat radiated resulted by the increase of body temperature during doing exercise).

The technical scheme of the present invention is an rGO-PEI/PVDF pyroelectric thin film, which consists of an rGO-PEI photothermal material layer and a PVDF film, wherein, the rGO-PEI photothermal material layer is fixed and attached to the surface of the PVDF film through the transparent film; and the said PVDF film is a flexible polarized PVDF film with double-side Ag film coating, wherein the mass percentage of R phase is higher than 90%; as well as the surface density of the said rGO-PEI photothermal material layer is 1 mg/cm2; wherein, the rGO-PEI photothermal material contains a grafting rate of PEI of 22.3%.

As the name suggests, the rGO-PEI photothermal material layer plays a role of photothermal conversion in the structure, which can convert sunlight into heat: in addition, the rGO-PEI is a material prepared by modifying GO through PEI, wherein, there are more π-bond structure will be brought in the rGO structure due to the introduction of the amide functional group of PEIs. The principle of photothermal conversion of carbon-based materials is: it is excited by loose π-electron (wherein, the π-electron can absorb the sunlight of the entire solar spectrum), and then the electron relaxation returns to the ground state, and thus results in the release of heat. Therefore, the additional O=C—N functional group, as an electron-donating group, would increase the density of π-electrons existed in rGO, and thus improve the photothermal absorption performance of the rGO-PEI photothermal material layer.

The flexible polarized PVDF film has pyroelectric effect. Such high polymer pyroelectric materials reveal high pyroelectric properties (the mass percentage of R phase can reach up to more than 90%). In addition, the polarized dipole has good orderliness, when the temperature changes, it would result in better reorientation of dipoles existed in the PVDF, and make the change of total polarization more obvious, and thus output higher power.

The mechanism of generating pyroelectricity through the rGO-PEI/PVDF pyroelectric thin film of the present invention is: the electric generator first converts solar energy into heat through the rGO-PEI photothermal material layer; and then, the change of temperature would (the generation of pyroelectricity requires temperature variation) result in the deformation (thermal expansion or contraction) of the rGO-PEIPVDF film which contacts with the photothermal material layer closely. The deformation occurred at this point is divided into two types: vertical deformation and horizontal deformation. Both of which generate electricity through highly oriented dipoles (H—C—C—F units) existed in the PVDF film, wherein, the vertical deformation (i.e., instant piezoelectric effect) would give rise to the extension or contraction of dipoles, and thus result in the total effect of enhancing or weakening the polarization; in addition, the horizontal expansion (horizontal deformation) occurred on one side of the film would give rise to the reorientation of dipoles, and thus weaken the total polarization of dipoles, which relates to the flexoelectric effect. Furthermore, the change of the total polarizability of dipoles over time can be measured by the change of the transmembrane voltage over time.

Further, the light transmissivity of the aforesaid transparent film is greater than 90%, and the coefficient of thermal expansion is $127 \times 10^{-6} K^{-1}$.

The transparent film is mainly used for fixing and encapsulation, which shall guarantee the maximum transmittance of sunlight to be reached firstly, and thus can irradiate on the rGO-PEI photothermal material layer. Thus, the preferred transparent film shall have the light transmissivity of more than 90%, which is made of polyethylene terephthalate with a coefficient of thermal expansion of $127 \times 10^{-6} K^{-1}$, and is approximate to the coefficient of thermal expansion of the PVDF film ($130 \times 10^{-6} K^{-1}$), and thus can avoid thermal expansion occurring with the rise of temperature, so that complete the separation of the rGO-PEI photothermal material layer and the pyroelectric layer of the PVDF film.

The present invention also provides the preparation method of the aforesaid rGO-PEI/PVDF pyroelectric thin film, which consists of following steps:

S1. Take PEI as a modifier to complete chemical modification to GO, and thus obtain the rGO-PEI photothermal material after preparation;

S2. Disperse the rGO-PEI photothermal material in the ethanol solution, and then form a layer of rGO-PEI photothermal material on the filter paper by means of suction filtration and dry it at room temperature, and thus obtain the rGO-PEI photothermal material layer;

S3. Utilize a transparent film to transfer and fix the rGO-PEI photothermal material layer on the surface of the polarized PVDF film, and fold the edge of the transparent film and attach it to the edge of the other surface of the polarized PVDF film, and thus obtain the rGO-PEI/PVDF pyroelectric thin film.

Further, the specific operation of the aforesaid step S1 is to make the GO into powder and disposed it in deionized water by ultrasonic, and then add KOH and PEI successively and stir them for 30 minutes to dissolve, and thus obtain a mixed solution, after that place the mixed solution in an oil bath at the temperature of 80° C. and stir for reaction for 10 hours, and then, centrifuge and wash the solution experienced reaction 3-4 times, as well as complete freeze drying, and thus obtain the rGO-PEI photothermal material.

Further, the mass ratio of the aforesaid GO powder to PEI is 1:30.

It can be found based on studies that sufficient grafting rate of PEI can increase the density of π-electron existed in graphene, and thus improves the light absorption capacity of the material. The present invention guarantees that the obtained rGO-PEI photothermal material contains a grafting rate of PEI of 22.3%, i.e., obtaining the rGO-PEI photothermal material with maximum grafting rate, through controlling the mass ratio of GO powder to PEI.

Further, the specific operation of the aforesaid step S2 is to suction and filter the ethanol solution of rGO-PEI through a filter paper with a pore size of 0.22 microns, and then control the surface density of the formed photothermal layer to 1 mg/cm2.

It can be found based on studies that the best photothermal conversion effect can be achieved when the surface density of the rGO-PEI photothermal material layer reaches 1 mg/cm2, thus, if the density is lower than this one, the photothermal material layer cannot fully absorb sunlight, on the contrary, if the density is higher, the absorption of photothermal material layer to sunlight would approach saturation point, and thus result in material waste.

The present invention also provides a self-energized bracelet based on the aforesaid rGO-PEI/PVDF pyroelectric thin film, which consists of the aforesaid rGO-PEI/PVDF pyroelectric thin film, a copper electrode, a rectifier bridge and a capacitor, wherein, the said copper electrode is connected to the surface of the PVDF film between the rGO-PEI photothermal material layer and the PVDF film, and extends from the surface of the PVDF film, and thus connects with the rectifier bridge and the capacitor successively.

It can be seen that the copper electrode plays the role of wire, which conducts the current left on the Ag film plated on the PVDF film, and then, the current would be rectified by the rectifier bridge, and transmitted to the capacitor for storage, and thus, provide instant power supply for electronic devices (such as detectors for human health). The self-energized bracelet of the present invention has an output power of up to 21.3 mW/m2, and thus can control the temperature during operation by generating temperature fluctuations through simple sweeping gesture, rather than utilizing additional mechanical devices, so that greatly facilitates practical applications.

The preparation process of the self-energizing bracelet is also very simple. As for the S3 step of the preparation method of the aforesaid rGO-PEI/PVDF pyroelectric thin film, prior to transferring and fixing the rGO-PEI photothermal material layer on the surface of the polarized PVDF film by utilizing the transparent film, the copper electrode should be fixed on the surface of the polarized PVDF film firstly, meanwhile, make the copper electrode extend out of the surface of the polarized PVDF film on which it located, and then transfer and fix the rGO-PEI photothermal material layer on the surface of one said of the polarized PVDF film where there was copper electrode had been fixed by utilizing the transparent film, after that, connect to the rectifier bridge and capacitor, and then complete such operations as adaptive cutting or folding, and thus form it into the shape of the bracelet.

As described above, the preparation process of the rGO-PEI/PVDF pyroelectric thin film and the self-energized bracelet of the present invention is extremely simple, and low-cost, which can be conducive to large-scale production. In addition, the produced devices can collect the optothermal energy generated during doing outdoor exercise by people, the heat existed in the air at night and the energy generated through evaporation of human sweat, and then provide instant power supply to electronic devices (such as detectors for human health).

The preparation process of the present invention is extremely simple, and low-cost, which can be conducive to large-scale production, wherein, the produced devices can collect the thermal energy existed in sunlight and surrounding air during doing outdoor exercise by people and provide instant power supply to electronic devices (such as detectors for human health). The rGO-PEI prepared through modification by utilizing PEI has high optical and thermal properties, and has a higher temperature variation ratio (dT/dt), which is approximate to 7.8±0.2° C./s (calculated by deduction based upon the time of exposure at the temperature of one sun), and is 15.7% higher than utilizing traditional graphene. The key point is that the design of transferring and fixing the rGO-PEI photothermal material layer on the surface of the polarized PVDF film by utilizing transparent film has a power output of up to 21.3 mW/m2.

The materials used in the present invention are all flexible, and thus make the prepared rGO-PEI/PVDF pyroelectric thin film can be cut into functional devices such as bracelet, and such bracelet can control the temperature by generating temperature fluctuations through simple sweeping gesture, rather than utilizing external mechanical devices, and thus realize the seamless connection of people's daily life.

BRIEF DESCRIPTION OF THE FIGURES

Based on the detailed description of the embodiments of the present invention in conjunction with the accompanying drawings below, these and/or other aspects and advantages of the present invention will become clearer and easier to understand, wherein.

DESCRIPTION OF THE INVENTION

For the purpose of helping those skilled in the art to understand the present invention better, the text below will describe the present invention in detail in conjunction with the accompanying drawings and specific embodiments.

Embodiment 1

A preparation method of a self-energized bracelet based on rGO-PEI/PVDF pyroelectric thin film, which consists of following steps:
1) Take PEI as a modifier to complete chemical modification to GO, and thus obtain the rGO-PEI photothermal material after preparation, wherein, the specific operation is: weigh 0.11 g of GO powder and disposed it in 100 ml of deionized water by ultrasonic, and then add 0.2 g of KOH and 3 g of PEI successively and stir them for 30 minutes to dissolve, and then place the mixed solution in an oil bath at the temperature of 80° C. and stir for reaction for 10 hours, finally, centrifuge and wash the solution experienced reaction 3-4 times, as well as complete freeze drying;
2) Disperse rGO-PEI in the ethanol solution, and then form a layer of rGO-PEI layer on the filter paper by means of suction filtration and dry it at room temperature, and thus obtain the rGO-PEI photothermal layer; wherein, the specific operation is: Disperse the rGO-PEI evenly in 6 ml of ethanol solution, and then drop them on the surface of filter paper evenly as well as guarantee that the surface density of the material is 1 mg/cm2, after that, complete suction filtration, and dry them at room temperature for 2 hours;
3) Separately paste the two copper electrodes on one surface of the polarized PVDF film;
4) Then, transfer and fix the rGO-PEI photothermal layer on the surface of the polarized PVDF film where there is a copper electrode is fixed by utilizing the transparent film (The transparent film utilized in the present embodiment is PET transparent tape), after that, connect it to the rectifier bridge and the capacitor at the extension end of the copper electrode, meanwhile, cut it into corresponding bracelet, and thus, obtain the self-energized bracelet based on rGO-PEI/PVDF pyroelectric thin film; it should be noted that the extra part of the transparent tape needs to be reserved and attached to the reverse side of the PVDF film, and thus guarantees the photothermal layer to contact with the pyroelectric layer closely.

Figure 1:
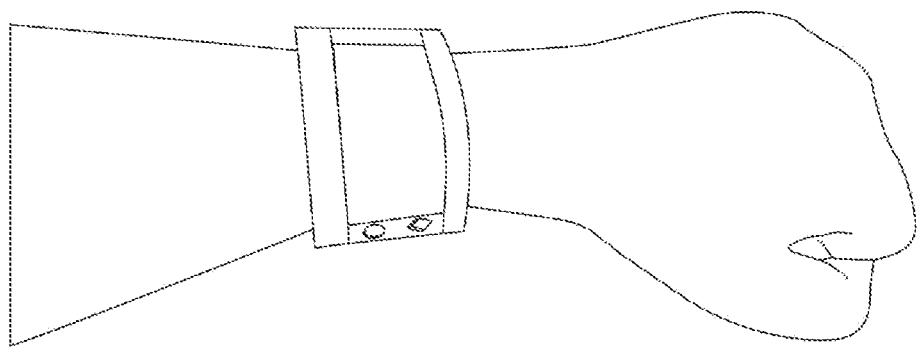
FIG. 1 is a schematic photo of the overall wearing of a self-energized bracelet based on the rGO-PEI/PVDF pyroelectric thin film prepared according to an embodiment of the present invention.
Figure 2:
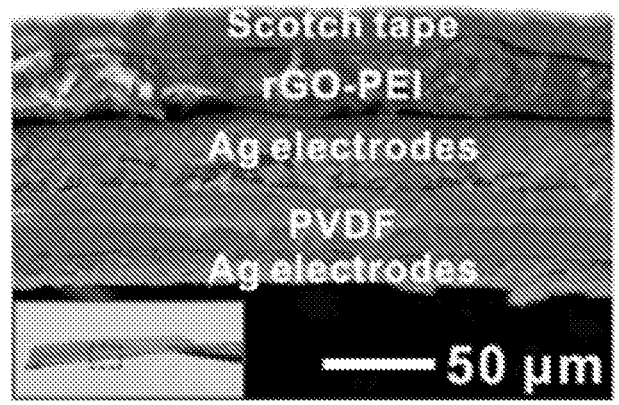
FIG. 2 is a schematic diagram of the layer structure composition of the rGO-PEI/PVDF pyroelectric thin film utilized by the self-energized bracelet based on the rGO-PEI/PVDF pyroelectric thin film prepared according to an embodiment of the present invention.

The overall structure and the layer structure of the obtained self-energizing bracelet based on rGO-PEI/PVDF pyroelectric thin film are shown in FIG. 1 and FIG. 2 respectively.

Embodiment 2

Figure 3:
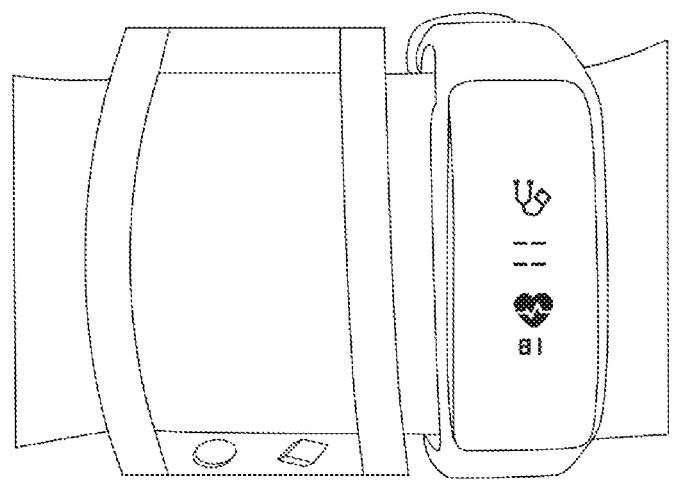
FIG. 3 is a photo showing the self-energized bracelet prepared according to an embodiment of the present invention to be used to collect heat generated by outdoor sunlight and then supply power to the human health monitor immediately.

In the event that wear the self-energized bracelet based on the rGO-PEI/PVDF pyroelectric thin film obtained in the embodiment 1 during doing outdoor exercise, the heat generated by the sunlight can be converted into pyroelectricity by virtue of the swing of the wrist when the human body walks, and the pyroelectricity will be stored in capacitor after being output through electrodes, and rectified by rectifier bridge, and thus can be used to provide power for the human health monitor immediately. The experimental result shows that: such self-energized bracelet can charge the human health monitor about 10% of electric energy, if walks for 1 hour under the sunshine, and its application is as shown in FIG. 3.

Embodiment 3

Figure 4:
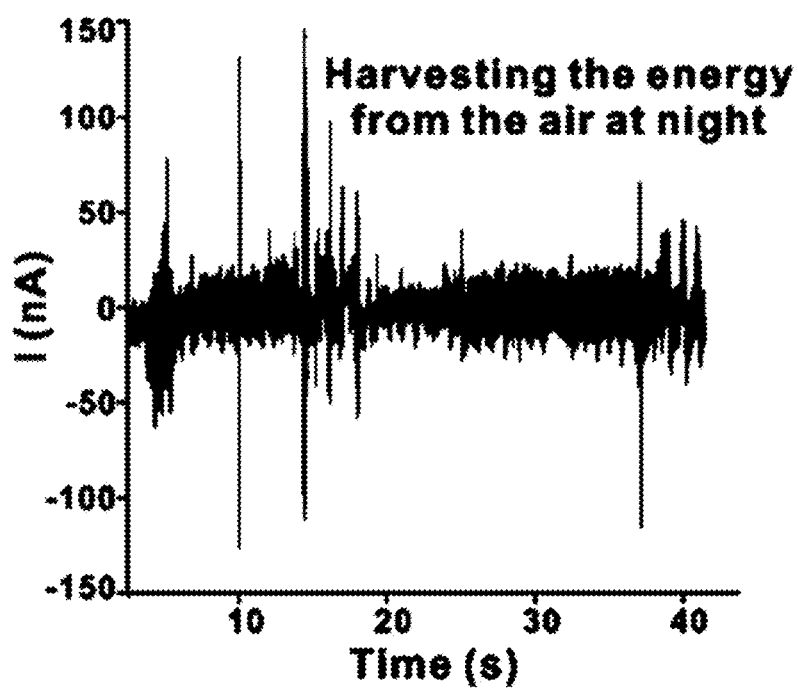
FIG. 4 is a time-current curve graph obtained in the case that the self-energized bracelet prepared according to an embodiment of the present invention collects heat existed in the air at night.

In the event that wear the self-energized bracelet based on the rGO-PEI/PVDF pyroelectric thin film obtained in the embodiment 1 during walking at night, the movement of the wrist will give rise to the temperature fluctuation of the airflow, and thus generate pyroelectricity, which will be stored in capacitor after being output through electrodes, and rectified by rectifier bridge, and thus can be used to collect energy existed in air at night, wherein, the correlation curve between the walking time of people and the current obtained is as shown in FIG. 4.

Embodiment 4

Figure 5:
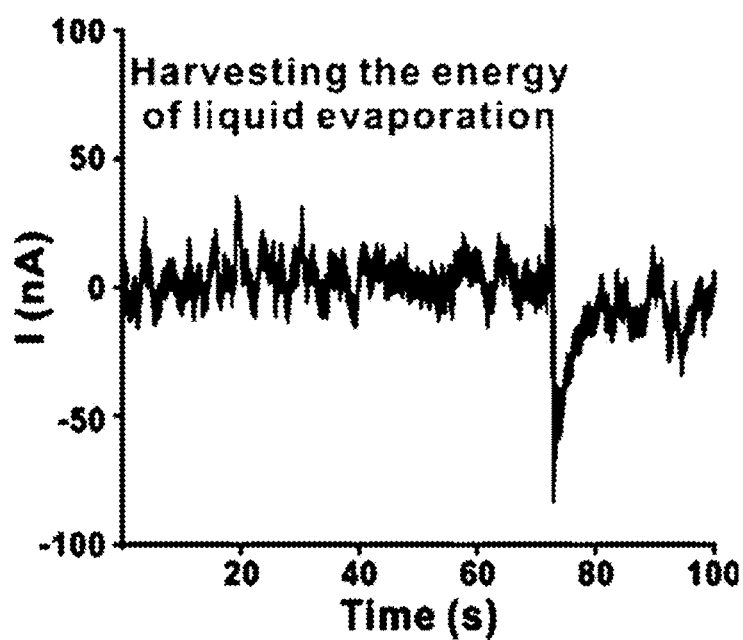
FIG. 5 is a time-current curve graph obtained in the case that the self-energized bracelet prepared according to an embodiment of the present invention is used to collect energy generated through evaporation of human sweat.

To collect the energy generated through evaporation of human sweat: wear the self-energized bracelet based on the rGO-PEI/PVDF pyroelectric thin film obtained in the embodiment 1 on the wrist of a person who did exercise and sweated, and the self-energized bracelet can generates electricity by means of the temperature variation occurred during the liquid evaporation process (simulating the evaporation of human sweat), wherein, the output current reaches in the range of around 20 nA, and the correlation curve between the time and the current obtained in the process of collecting the energy generated through evaporation of human sweat is as shown in FIG. 5.

In conclusion, the self-energized bracelet based on the rGO-PEI/PVDF pyroelectric thin film of the present invention can collect the optothermal energy, the heat existed in the air at night, and the energy generated through evaporation of human sweat during doing outdoor exercise by people, which can be used to provide instant power supply to electronic devices (such as detectors for human health).

The embodiments of the present invention have been described above, and such description is exemplary, rather than exhaustive, and is not limited to the disclosed embodiments. In addition, various modifications and variations without departing from the scope and spirit of the described embodiments are obvious to those of ordinary skill in the art. Therefore, the protection scope of the present invention should be subject to the protection scope of the claims.

The invention claimed is:

1. A preparation method of a reduced graphene oxide (rGO)-polyethyleneimine (PEI)/polyvinylidene fluoride (PVDF) pyroelectric thin film, comprising:
Step 1. taking PEI as a modifier to complete chemical modification to GO (graphene oxide), and thus obtaining an rGO-PEI photothermal material after preparation comprises;
weighting GO powder and disposing the GO powder in deionized water by ultrasonic, adding KOH (Potassium hydroxide) and the PEI successively and stirring for 30 minutes to dissolve, and thus obtaining a mixed solution; and placing the mixed solution in an oil bath at a temperature of 80° C. and stirring for reaction for 10 hours, centrifuging and washing the solution experienced reaction 3-4 times, performing freeze drying, and thus obtaining the rGO-PEI photothermal material;

Step 2. dispersing the rGO-PEI photothermal material in an ethanol solution, forming a layer of rGO-PEI photothermal material on a filter paper by means of suction filtration and drying the layer of rGO-PEI photothermal material at room temperature, and thus obtaining an rGO-PEI photothermal material layer;

Step 3. utilizing a transparent film to transfer and fix the rGO-PEI photothermal material layer on a surface of a PVDF film, and folding an edge of the transparent film and attaching the edge of the transparent film to an edge of the other surface of the PVDF film, and thus obtaining the rGO-PEI/PVDF pyroelectric thin film.

2. The preparation method of the rGO-PEI/PVDF pyroelectric thin film according to claim 1, wherein a mass ratio of the GO powder to the PEI is 1:30.

3. The preparation method of the rGO-PEI/PVDF pyroelectric thin film according to claim 1, wherein a pore size of the filter paper is 0.22 microns, and a surface density of the rGO-PEI photothermal material layer is 1 mg/cm$^2$.

* * * * *